United States Patent [19]
Hotvedt

[11] 4,390,837
[45] Jun. 28, 1983

[54] TEST UNIT FOR A LOGIC CIRCUIT ANALYZER

[76] Inventor: Kevin Hotvedt, 1826 Vera Ave., Redwood City, Calif. 94061

[21] Appl. No.: 180,849

[22] Filed: Aug. 25, 1980

[51] Int. Cl.³ .......................................... G01R 15/12
[52] U.S. Cl. ............................... 324/73 R; 324/158 F
[58] Field of Search ............ 324/73 R, 73 PC, 158 F, 324/121 R, 72.5, 133, 140

[56] References Cited

U.S. PATENT DOCUMENTS

| | | | |
|---|---|---|---|
| 3,098,219 | 7/1963 | Voigt et al. | 324/73 R |
| 3,161,827 | 12/1964 | Buisson | 324/121 |
| 3,370,232 | 2/1968 | Wickersham | 324/73 R |
| 3,602,810 | 8/1971 | Nicolantonio | 324/73 R |
| 3,750,015 | 7/1973 | Sheter | 324/72.5 |
| 3,818,339 | 6/1974 | Black | 324/140 R |
| 3,831,149 | 8/1974 | Job | 324/73 R |
| 3,903,471 | 9/1975 | Hirnga | 324/133 |
| 3,946,310 | 3/1976 | Saper | 324/72.5 |
| 4,016,492 | 4/1977 | Miller | 324/128 |
| 4,145,651 | 3/1979 | Ripingill | 324/72.5 |
| 4,309,657 | 1/1982 | Lockhart | 324/73 R |

Primary Examiner—Michael J. Tokar
Attorney, Agent, or Firm—Fliesler, Dubb, Meyer & Lovejoy

[57] ABSTRACT

A test unit for identifying output signals at test points of a logic circuit on an oscilloscope and being operable in a real time mode or a memory mode. In the real time mode, the oscilloscope is triggered by any selected one of several signals and, at this time, output signals sensed by test probes are displayed on the oscilloscope. In the memory mode, the output signals are written into a memory. In response to the selected one signal, the output signals written into the memory before or after the occurrence of the selected one signal can be selected for display on the oscilloscope.

22 Claims, 8 Drawing Figures

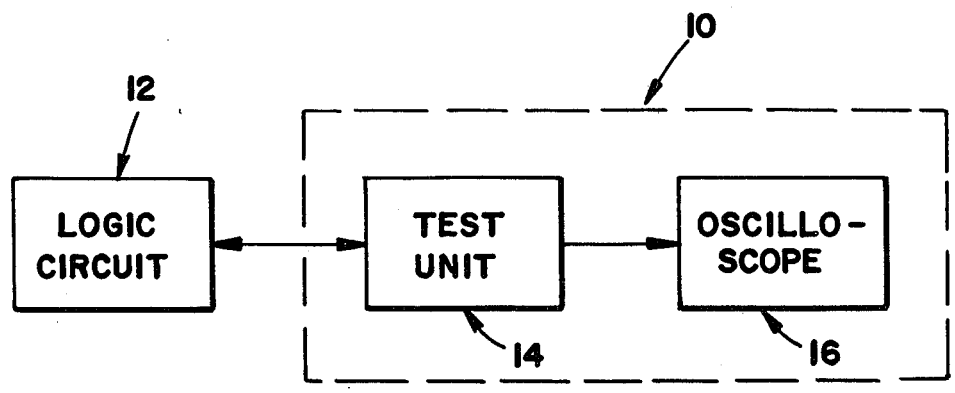
FIG_1
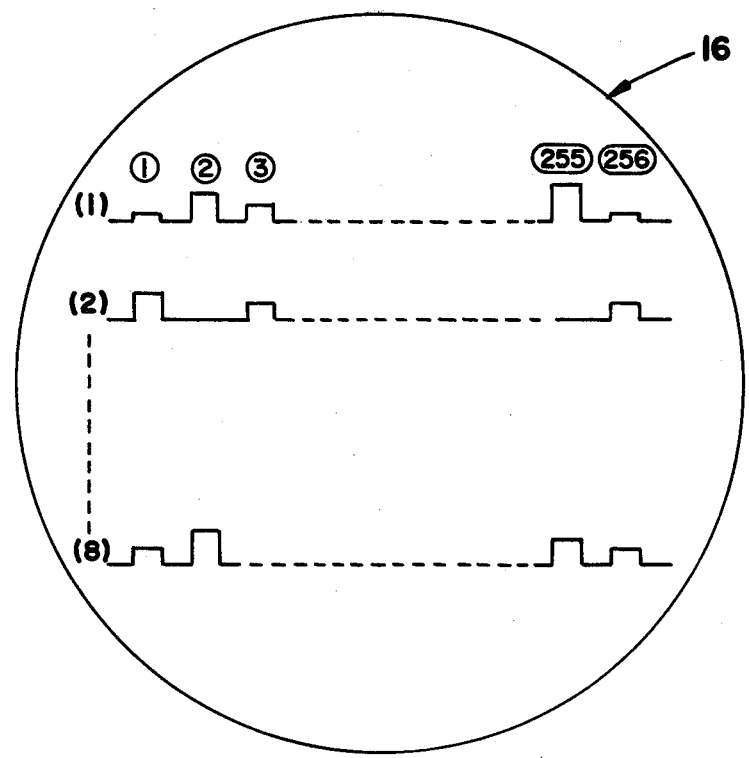
FIG_7

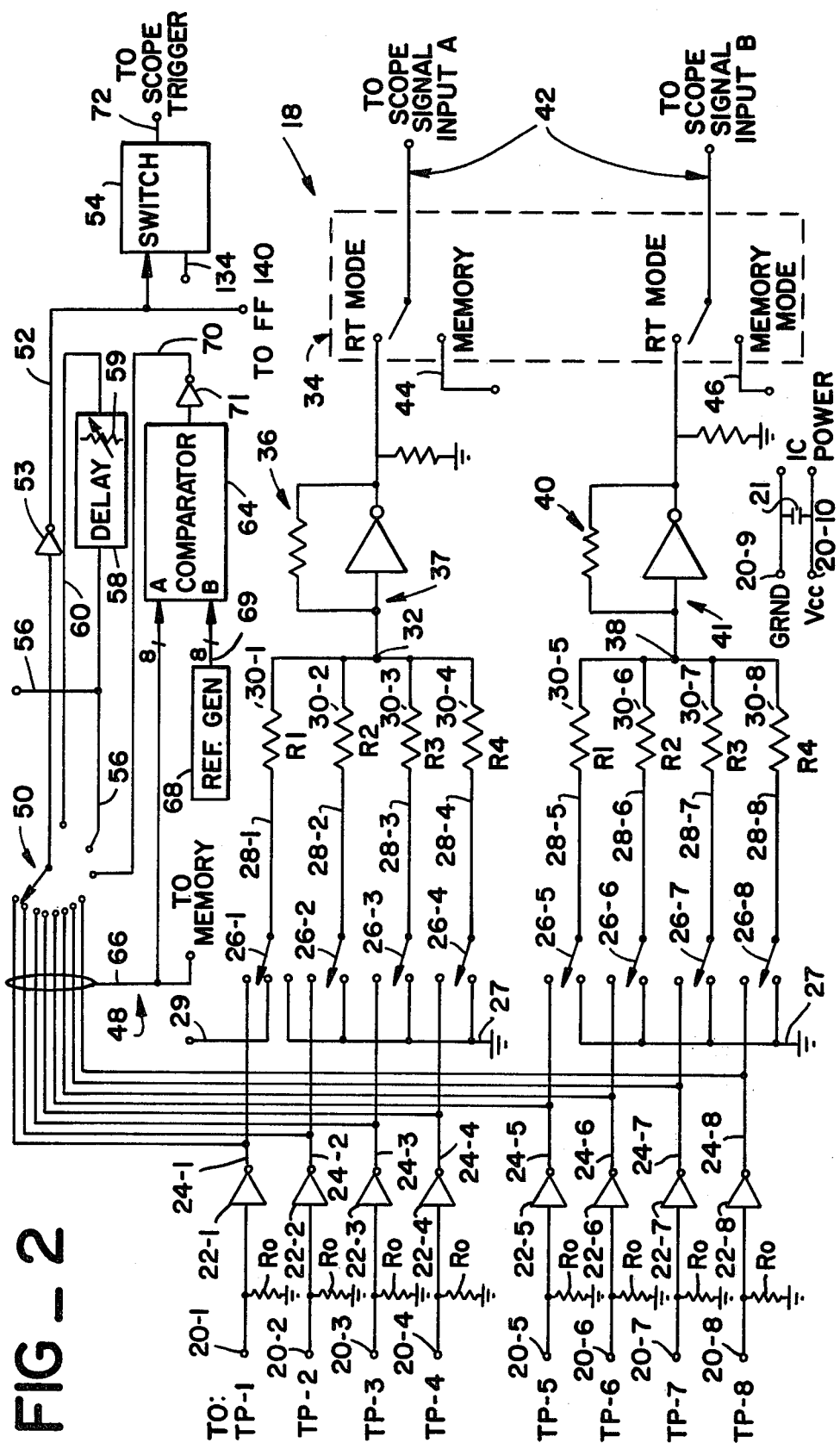
FIG_2

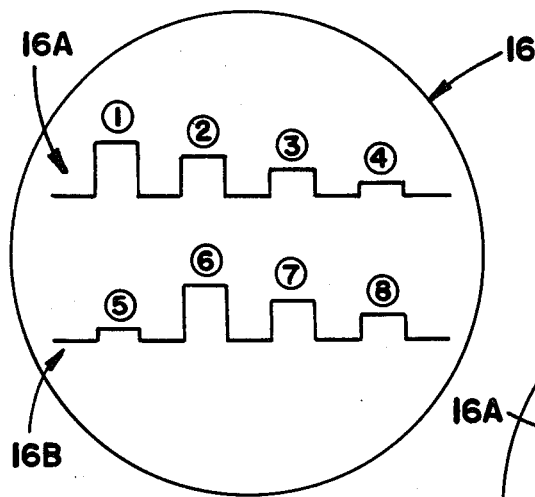
FIG_3
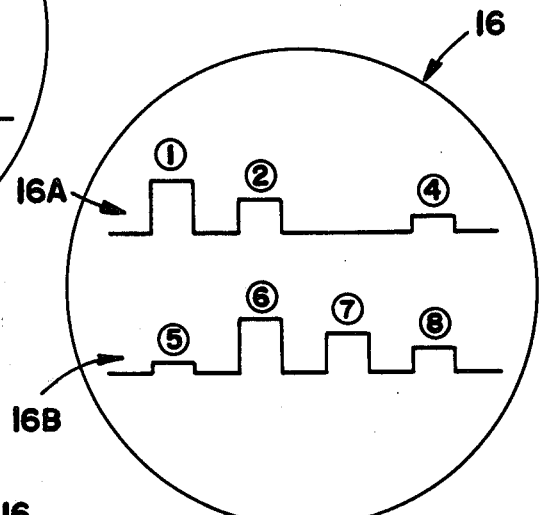
FIG_4
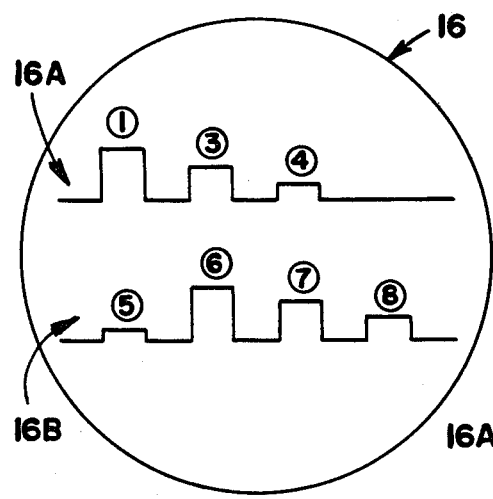
FIG_5A
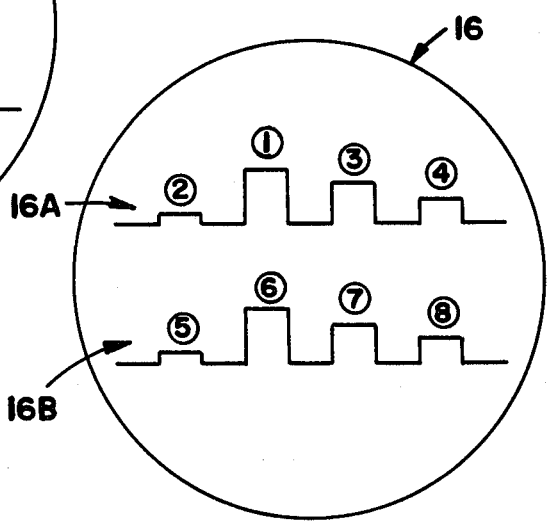
FIG_5B

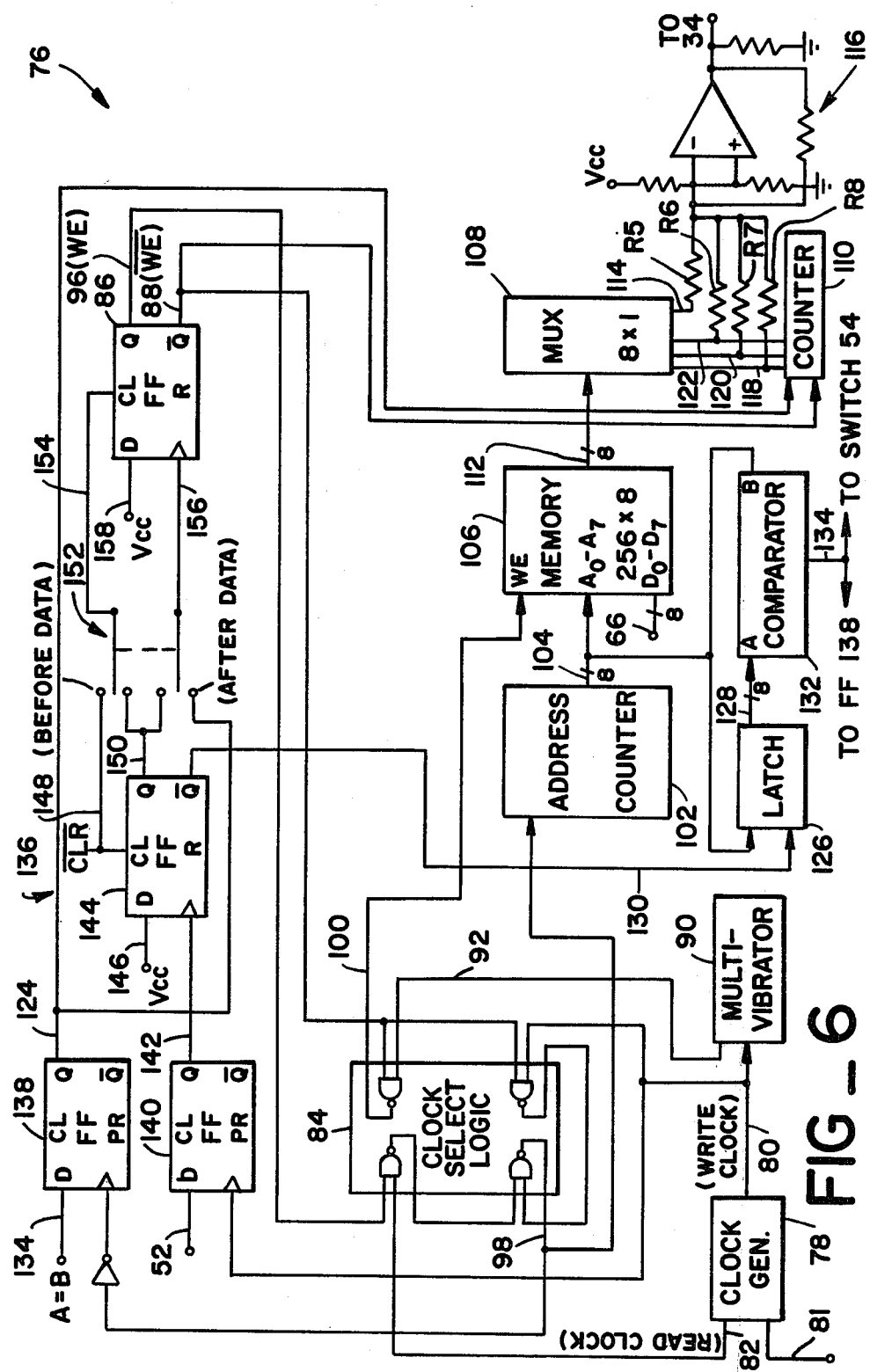
FIG_6

4,390,837

TEST UNIT FOR A LOGIC CIRCUIT ANALYZER

BACKGROUND OF THE INVENTION

The present invention relates to logic circuit analyzers and, more particularly, to a test unit of an overall analyzer for testing or identifying the output signals at various points in a logic circuit.

A large number of logic components such as gates are implemented on integrated circuits and a large number of integrated circuits constituting a logic circuit or system commonly are produced on a printed circuit (PC) board. As is known, this logic circuit can fail as a result of, for example, manufacturing defects or improper operation of the circuit. As a result of these failures, improper logic states can be produced at various output points of the failed circuit.

A large variety of logic circuit analyzers have been developed to test the logic components of the logic circuit. Typically, the analyzers have a combined test unit and display. A single probe of the test unit is placed on a test point of the logic circuit at the output of the logic component being tested. The test probe senses the output signal at the test point, which is then fed by the test unit to the display where it is displayed on the screen. These analyzers may have multiple test probes which can be applied to multiple test points for displaying simultaneously corresponding output signals on respective traces of the display. Should one or more of the logic components have failed, this will be indicated by the improper output signal or signals being displayed on the oscilloscope.

A logic circuit state indicator is disclosed in U.S. Pat. No. 3,602,810, in which a plurality of output signals from different test points of a logic circuit are displayed simultaneously on a single trace of an oscilloscope. This is accomplished by using a plurality of probes and a plurality of weighted resistors connected, respectively, to the probes. The resistors are also connected in common to a summing junction which is coupled to the oscilloscope. The test probes are placed on individual test points, with the output signals being fed through the weighted resistors to the summing junction for display on the oscilloscope. By means of the weighted resistors, the output signals from each test point appearing on the single trace can be distinguished from one another, whereby a corresponding failed component can be determined.

A disadvantage with the logic circuit state indicator of the above-mentioned patent is that it is designed only for use in testing a predetermined logic circuit. That is, the logic circuit state indicator is built into a logic circuit whose output signals or pulses at various test points are known at any instant of time. If the pulse waveform on the oscilloscope is not the expected waveform, then component failure can be determined. This logic circuit state indicator is not a general logic circuit analyzer which can be employed to determine component failures in any logic circuit.

SUMMARY OF THE INVENTION

It is an object of the present invention to provide a novel logic circuit test unit.

Another object of the present invention is to provide a general purpose test unit for testing any logic circuit.

Yet another object of the present invention is to provide a test unit which has greater versatility and ease of use over prior test units, and is cost effective over such prior test units.

The above and other objects of the present invention are obtained with a test unit for identifying output signals at a plurality of test points of a logic circuit on an oscilloscope having a scope signal input and a scope triggering input, in which the test unit includes a plurality of test probes being connectable to the plurality of test points to sense the output signals, respectively, means for producing summed signals, a plurality of impedance elements having different weighted values, each of the impedance elements being connected between one of the test probes and the producing means, means for coupling the summed signals to the scope signal input, means for selectively coupling and decoupling the test probes from the producing means, and means for supplying a triggering signal to the scope triggering input in response to one of the sensed output signals.

In operating the test unit of the present invention, a plurality of output signals of the logic circuit can be simultaneously detected on a single trace of an oscilloscope. If, for example, two of the test probes are placed on test points such that corresponding signals appearing on the oscilloscope are very close together or overlap, then one of the test probes can be effectively removed to view the other signal more clearly. Also, if, for example, test probe #1 is placed on test point #1 and test probed #2 is placed on test point #2, but the output signal of the corresponding logic circuit component occurs first at test point #2 and then at test point #1, the oscilloscope can be supplied with a triggering signal in response to the output signal from test point #2.

The above and other advantageous features which make the test unit of the present invention a general purpose unit will be described in more detail below.

BRIEF DESCRIPTION OF THE DRAWINGS

FIG. 1 is a block diagram of an overall logic circuit analyzer.

FIG. 2 is a schematic illustration of a circuit of the test unit of the present invention.

FIGS. 3–4, 5A, 5B show traces on an oscilloscope for explaining the present invention.

FIG. 6 is a schematic illustration of another circuit of the test unit of the present invention.

FIG. 7 shows a trace of an oscilloscope for explaining the present invention.

DETAILED DESCRIPTION OF THE INVENTION

FIG. 1 shows an overall logic circuit analyzer 10 which is used to analyze any type of logic circuit 12 and which includes a test unit 14 and a conventional oscilloscope 16 that can be a single trace or a multi-trace scope. Test unit 14 is manufactured as a separate unit from the oscilloscope 16 for coupling to the logic circuit 12 and to the oscilloscope 16. Test unit 14 functions to sense output signals at a plurality of test points of the logic circuit 12 and to convert these signals for identification on the oscilloscope 16. Two modes of operation can be performed with the test unit 14, one being termed a real time mode and the other being termed a memory mode.

Real Time Mode

FIG. 2 illustrates a circuit 18 that is part of the test unit 14. Circuit 18 includes a first set or plurality of test probes 20-1 to 20-4 and a second set or plurality of test probes 20-5 to 20-8. The test probes 20-1 to 20-8 can be respectively coupled to test points TP-1 to TP-8 of the logic circuit 12 to sense output signals from logic components of the circuit 12 such as logic gates. Two additional probes 20-9 and 20-10 of circuit 18 can be coupled to the logic circuit 12 to produce a filtered power supply for the circuit 18, as well as the circuit to be described for FIG. 6, using a capacitor 21.

A plurality of inverting buffers 22-1 to 22-8 produce inverted signals on respective output lines 24-1 to 24-8 in response to the signals being sensed by test probes 20-1 to 20-8. The inverting buffers 22-1 to 22-8 ensure that there is only one load per respective test point TP-1 to TP-8. Feed-in resistors Ro are connected to the inverting buffers 22-1 to 22-8 so that if a corresponding test probe 20-1 to 20-8 is not on a test point TP-1 to TP-8, the output of a buffer 22-1 to 22-8 will be high. This is important primarily for the memory mode to be described to prevent spurious signals from effecting this mode.

A plurality of manual add/subtract switches 26-1 to 26-8 can be switched to selectively coupled respective lines 24-1 to 24-8 or a grounded line 27 to respective lines 28-1 to 28-8. Switch 26-1, in addition to being connectable to line 24-1 or line 27, can also be connected to a line 29 carrying clock pulses which are used for the memory mode to be described below. A plurality of impedance elements 30-1 to 30-4 are on lines 28-1 to 28-4 respectively and can be, for example, resistors having different weighted resistance values $R_1-R_4$, respectively. Similarly, a plurality of impedance elements 30-5 to 30-8 are on lines 28-5 to 28-8 respectively and also can be, for example, resistors having the weighted resistance values $R_1-R_4$, respectively. As will be seen, values $R_1-R_4$ are different from one another to distinguish the output signals from test points TP-1 to TP-4 and test points TP-5 to TP-8 on different traces of oscilloscope 16.

A summing junction 32 is connected in common to lines 28-1 to 28-4 to couple summed signals to a switch 34 through an amplifier 36. Summing junction 32 and amplifier 36 together form a summing amplifier 37. A summing junction 38 is connected in common to lines 28-5 to 28-8 to couple summed signals to the switch 34 through an amplifier 40. Summing junction 38 and amplifier 40 together form a summing amplifier 41. Switch 34 can be switched into a real time mode position (RT) in which the summed signals produced by summing amplifier 37 are coupled to a scope signal input A of the oscilloscope 16 and the summed signals produced by summing amplifier 41 are coupled to a scope signal input B of the oscilloscope 16 over a cable connector 42 that can be plugged into oscilloscope 16. Switch 34 also can be switched into a memory mode position at which a line 44 and a line 46 are coupled, respectively to the cable connector 42, as will be further described in connection with FIG. 6.

A scope triggering circuit 48 includes a manual, rotary, trigger select switch 50 that can be rotated through various positions to connect any one of the lines 24-1 to 24-8 to a line 52 via an inverter 53. When in any one of these position, switch 50 couples the signal on the corresponding lines 24-1 to 24-8 via line 52 to a manual mode selection switch 54 to act as a triggering signal, as will be further described. A line 56 of triggering circuit 48 can be coupled to logic circuit 12 to receive a signal which is applied externally to the logic circuit 12. A variable delay 58 having a potentiometer 59 can delay the external signal being received on line 56 and couple the delayed external signal onto a line 60. Switch 50 can also be rotated to couple the undelayed external signal on line 56 or the delayed external signal on line 60 to switch 54 via line 52. Thus, the external signal, either undelayed or delayed, can function as a triggering signal.

A comparator 64 of triggering circuit 48 receives an 8-bit number over an 8-bit line 66 corresponding to the data or signals on lines 24-1 to 24-8. A reference signal generator 68 can generate an 8-bit, selectable, reference number which is inputted over an 8-bit line 69 to comparator 64. Generator 68 has 8 openable and closeable switches (not shown), each of whose positions represent a logic 1 or logic 0, to produce any 8-bit reference number. Comparator 64 produces an output signal on an output line 70 via an inverter 71 when the 8-bit number on line 66 equals the 8-bit number on line 69. Manual switch 50 can be rotated to yet another position to couple line 70 to line 52, thereby enabling the output signal of comparator 64 to function as a triggering signal.

Mode selection switch 54 can be switched to couple the triggering signal on line 52 onto an output line 72 that leads directly to the scope trigger input of the oscilloscope 16. This position of the switch 54 is used for the real time mode. Switch 54 can also be switched to another state to couple a signal on a line 134 to output line 72. This position of switch 54 is used for the memory mode.

In the operation of test unit 14 for the real time mode, switch 34 is placed in the real time mode position to couple the output signals of summing amplifier 37 and summing amplifier 41 to scope signal input A and scope signal input B, respectively, of oscilloscope 16. Switch 54 is moved into the real time mode position to couple line 52 to line 72 to produce a scope trigger signal for oscilloscope 16. Assume that switches 26-1 to 26-4 are in the position coupling lines 24-1 to 24-4 to lines 28-1 to 28-4 and that switches 26-5 to 26-8 are in the position coupling lines 24-5 to 24-8 to lines 28-5 to 28-8. Also assume that switch 50 is in the position coupling line 24-1 to line 52.

Now, test probes 20-1 to 20-8 are coupled to respective test points TP-1 to TP-8 on the logic circuit 12. The signals sensed by test probes 20-1 to 20-4 are fed, respectively, via inverter buffers 22-1 to 22-4, through switches 26-1 to 26-4 and impedance elements 30-1 to 30-4, to junction 32 of summing amplifier 37. Summed output signals from summing amplifier 37 are then fed to scope signal input A of oscilloscope 16 through switch 34. Similarly, the signals sensed by test probes 20-5 to 20-8 are fed, respectively, via inverter buffers 22-5 to 22-8, through switches 26-5 to 26-8 and impedance elements 30-5 to 30-8, to junction 38 of summing amplifier 41. Consequently, summed output signals from summing amplifier 41 are coupled to scope signal input B of the oscilloscope 16 via switch 34. Simultaneously, the sensed signal on line 24-1 is fed through switch 50, over line 52 and through switch 54 onto line 72 to trigger the oscilloscope 16.

FIG. 3 shows a dual trace of oscilloscope 16 resulting from the coupling of the test probes 20-1 to 20-8 to the logic circuit 12. One trace 16A displays the summed signals being received at scope signal input A from switch 34. In this example, four separate pulses 1-4 are displayed, which identify the signals being sensed by test probes 20-1 to 20-4, respectively. Another trace 16B displays the summed signals being received at signal input B of the oscilloscope 16. In this example, four additional, separate pulses 5-8 are displayed, which identify the signals being sensed by test probes 20-5 to 20-8.

Now assume, for example, that test probe 20-3 has been placed on a test point TP-3 such that pulse 3 shown in trace 16A occurs at a point in time so as to at least partially overlap pulse 2. This overlap might make it difficult to distinguish between pulse 2 and pulse 3, thereby making it difficult to determine if the correct output signals are being produced by the components of logic circuit 12 at which test probes 20-2 and 20-3 are coupled. To avoid this difficulty, add/subtract switch 26-3 can be moved from line 24-3 and coupled to grounded line 27. Test probe 20-3 thus is effectively decoupled from summing amplifier 37. As a result, and as shown in FIG. 4, pulse 3 is removed or subtracted from trace 16A to avoid this ambiguity. Similarly, any one or more of the switches 26-1 to 26-8 can be moved to line 27 to subtract corresponding pulses 1-8 from trace 16A and trace 16B. If these switches 26-1 to 26-8 are moved again to lines 24-1 to 24-8, the corresponding pulses 1-8 are again added to the traces 16A and 16B.

The add/subtract switches 26-1 to 26-8 also may be used to better analyze a logic circuit 12 in another way. For example, if logic circuit 12 were a 4-bit microprocessor system, two bits or states could be shown on one trace 16A and two bits or states could be shown on trace 16B by appropriately positioning the add/subtract switches 26-1 to 26-8 to subtract the four remaining states from these traces. Then, switches 26-1 to 26-8 can be positioned to subtract the first set of four states and the remaining four states may be displayed. By switching back and forth switches 26-1 to 26-8, the microprocessor system can be monitored as it steps through its states, without having to move test probes 20-1 to 20-8.

Assume again that all the switches 26-1 to 26-8 are coupled to respective lines 24-1 to 24-8 and that switch 50 is coupled to line 24-1. Another problem that can occur, as indicated by trace 16A shown in FIG. 5A, is that the test probes 20-1 to 20-4 are placed on test points TP-1 to TP-4, with the oscilloscope 16 being triggered by the signal on line 24-1. However, in this example, the signal first occurring in time and thus first being sensed by the test probes 20-1 to 20-4 appears at test point TP-2. Since oscilloscope 16 is being triggered by the signal from test probe 20-1 on line 24-1, the signal from test point TP-2 will not be seen on trace 16A. Rather, only the signals from test points TP-1, TP-3 and TP-4 are identified on trace 16A as pulses 1, 3 and 4.

This problem is solved by rotating switch 50 to connect line 24-2 to line 52 and hence switch 54 so that oscilloscope 16 is triggered by the signal occurring at test point TP-2. The result is a trace 16A shown in FIG. 5B in which all the signals from test points TP-1 to TP-4 are identified. Since the signal occurring at test point TP-2 is first in time, the order of pulses on trace 16A is 2, 1, 3, 4. Similar problems can be alleviated by rotating the switch to any one of lines 24-1 to 24-8 to trigger the oscilloscope 16 with the corresponding signals.

The circuit 18 also is versatile in that the signals occurring at test points TP-1 to TP-8 can be identified at the time an external signal is applied to the logic circuit 12. At such a time, this external signal is also applied to line 56. If switch 50 is in the position connecting line 56 to line 52, then the external signal is fed through switch 54 onto line 72 to trigger the oscilloscope 16. Simultaneously, the summed signals from summing amplifier 37 and summing amplifier 41 will be fed to scope signal input A and scope signal input B for display as traces 16A and 16B, respectively.

Alternatively, a delayed external signal can be used to trigger oscilloscope 16 by rotating switch 50 to connect line 60 to line 52. The delayed external signal may be needed to delay triggering oscilloscope 16 so that pulses 1-4 and pulses 5-8 of trace 16A and trace 16B are centered on the screen of oscilloscope 16. Otherwise, for example, pulse 4 may occur in time subsequent to the undelayed external signal such that it would appear only partially or not at all on oscilloscope 16. Potentiometer 59 can be manually adjusted to vary appropriately the delay.

The versatility of circuit 18 also is accomplished by being able to identify any one predetermined 8-bit number occurring at test ponts TP-1 to TP-8. This is accomplished by presetting reference signal generator 68 to an 8-bit number, e.g., 10111111, and rotating switch 50 to connect line 70 to line 52. When the 8 bits or signals corresponding to the predetermined number are sensed by test probes 20-1 to 20-8, the 8-bit numbers on line 66 and line 69 are equal. Comparator 64 thereby produces an output signal on line 70 which is coupled through switch 50, line 52 and switch 54 onto line 72 to trigger oscilloscope 16. Consequently, this 8-bit number will appear on oscilloscope 16, with 4 bits or pulses being displayed on trace 16A and 4 bits or pulses being displayed on trace 16B, as well as any additional information sensed by test probes 20-1 to 20-8 and occurring thereafter within the sweep time of the oscilloscope 16.

As yet another alternative, for some applications it may be desirable to know the status of, for example, four test points when a predetermined number appears at four other test points. This can be accomplished by modifying comparator 64 to receive only a 4-bit number from generator 68 and to receive only a 4-bit number on line 66. More particularly, assume that it is desirable to know the status of the four test points TP-5 to TP-8 when a predetermined number occurs at test points TP-1 to TP-4. Generator 68 is preset so that comparator 64 receives the predetermined 4-bit number and line 66 is connected to lines 24-1 to 24-4. Then, when the 4-bit number at test points TP-1 to TP-4 occurs, comparator 64 produces an output signal on line 70 which ultimately triggers oscilloscope 16. At this time, therefore, the status of test points TP-5 to TP-8 will appear on trace 16B of oscilloscope 16.

Memory Mode

FIG. 6 shows a circuit 76 that is part of the test unit 14. A clock generator 78 produces an internally generated, write clock pulse train on an output line 80 and an internally generated read clock pulse train on an output line 82. The clock generator 78 can be manually controlled to vary the frequency of the internally generated write clock pulses on line 80, whereas the frequency of the internally generated read clock pulses on line 82 is fixed. For reasons to be described further below, clock generator 78 can also receive an external clock on an input line 81 and can be switched manually to couple this external clock onto line 80 as a write clock in lieu of the internally generated write clock.

A clock select logic 84 has one input connected to the line 80 and another input connected to the output $\bar{Q}$ of a flip-flop 86 over a line 88. Clock select logic 84 has another input connected to the output of a one-shot multivibrator 90 over a line 92 and another input connected to line 88 also to receive the output $\bar{Q}$ from flip-flop 86. Yet two other inputs of the clock select logic 84 are connected, respectively, to line 82 carrying the read clock and a line 96 coupled to the output Q of flip-flop 86. Clock select logic 84 has one output coupled to a line 98 which carries the selected write clock or read clock and another output on a line 100 carrying memory write enable pulses WE to be discussed further below.

In the operation of clock select logic 84, assume that flip-flop 86 is cleared so that the output $\bar{Q}$ on line 88 is high and the output Q on line 96 is low. With the output $\bar{Q}$ on line 88 being high, the write clock on line 80 is gated by clock select logic 84 onto the line 98. Also, each pulse of the write clock on line 80 triggers multivibrator 90 to produce a high on line 92. With the output $\bar{Q}$ on line 88 also being high, the memory write enable pulses WE are produced by clock select logic 84 on line 100 a short time after each pulse of the write clock is outputted on line 98.

Assume now that the state of flip-flop 86 is changed so that the output Q on line 96 is high and the output $\bar{Q}$ on line 88 is low. Consequently, with the signal on line 96 being high, clock select logic 84 gates the read clock on line 82 onto line 98. Also, with the output $\bar{Q}$ on line 88 being low, the memory write enable pulses WE are no longer produced on line 100.

An 8-bit address counter 102 is incremented by the clock on line 98 to produce 8-bit memory addresses on an output line 104. A memory 106, having a capacity of 256×8 bits, is addressed with the 8-bit address on line 104. Memory 106 is in the write mode when it receives the write enable pulses on line 100; otherwise, memory 106 is in the read mode. Memory 106 stores 8-bit data being received from line 66 of FIG. 2, which data corresponds to the sensed signals from test probes 20-1 to 20-8.

When the test unit 14 is powered on, clock generator 78 will provide the write clock on line 80 and the read clock on line 82. Also, flip-flop 86 will be cleared so that output $\bar{Q}$ on line 88 is high and output Q on line 96 is low. Therefore, the clock select logic 84 will select the write clock so that address counter 102 is incremented at the rate of the write clock on line 98. Also, clock select logic 84, via the input signals on line 88 and line 92, will produce the write enable pulses WE on line 100 to enable memory 106 a short time after address counter 102 has been incremented and has settled to a new count. As a result, memory 106 will be addressed and enabled to store 8-bit data appearing on line 66 at 256 address locations. Address counter 102 circulates through its count capacity to update the data being stored in memory 106. This writing in of data on memory 106 occurs whether the test unit 14 is in the memory mode or the real time mode.

Data is read from memory 106 and displayed on the screen of oscilloscope 16 in the following manner. Assume the state of flip-flop 86 has changed so that the output Q on line 96 is high and the output $\bar{Q}$ on line 88 is low. Consequently, clock select logic 84 will select the read clock from line 82 and produce this clock on line 98. Memory 106, therefore, is in the read state and is addressed by the addresses on line 104 as the rate counter 102 is incremented by the read clock on line 98.

An 8×1 multiplexer 108 is addressed by a 3-bit address counter 110 and receives the data being read from memory 106 over an 8-bit input line 112. Multiplexer 108 outputs a selected data bit from each 8-bit input over a line 114 and through a resistor $R_5$ to an amplifier 116. Counter 110 produces a 3-bit output on lines 118, 120 and 122 to address the multiplexer 108 and to produce a DC shift via resistors $R_6$, $R_7$ and $R_8$, respectively, for adequately displaying the data stored in memory 106 on the oscilloscope 16, as will be further discussed. Counter 110 is enabled by the low on line 88, i.e., when memory 106 is in the read state, and is incremented by 1 each time a pulse is received on an input line 124.

The amplified output bits from amplifier 116 are fed to line 44 and line 46 shown in FIG. 2. When switch 34 and switch 54 are in the memory mode position, and assuming the oscilloscope 16 has been triggered, the data read from memory 106 will be displayed on oscilloscope 16, as shown in FIG. 7.

In the overall operation of reading the data from memory 106, and displaying the read data on oscilloscope 16, each time counter 110 is incremented by the pulse on line 124, multiplexer is addressed to select one of the 8 columns or channels of memory 106. Then, as memory 106 is addressed through the 256 address locations by counter 102, 256 bits in the selected column are sequentially output on line 114, through amplifier 116 and then lines 44, 46. The result is one trace of 256 bits being displayed on oscilloscope 16 at, for example, trace 1 shown in FIG. 7. Then, after counter 102 cycles through its count of 256 addresses, counter 110 is incremented again by another pulse on line 124 to address multiplexer 108 to select the next channel in memory 106. Thereafter, memory 106 is addressed by counter 102 at all 256 locations so that another 256 bits are displayed as shown by trace 2 on oscilloscope 16. This process continues for reading and displaying 8 channels of data, 256 bits each, as shown by traces 1–8 of FIG. 7.

To trigger oscilloscope 16 in the memory mode, a latch 126 receives the 8-bit addresses on line 104 from address counter 102. These 8-bit addresses are transferred by latch 126 onto an 8-bit output line 128 until a latching pulse is received on an input line 130 to latch a particular address being received. A comparator 132 also receives the 8-bit addresses on line 104 and compares these with the addresses being received on line 128. When the two received addresses are equal, comparator 132 generates a high on an output line 134 which is fed to the switch 54 shown in FIG. 2. When switch 54 is in the memory mode position, line 134 is coupled to line 72 so that this high ultimately triggers the oscilloscope 16.

A circuit 136 is used to control the writing and reading of data into and out of memory 106 and to control incrementing the counter 110. A D-type flip-flop 138 has its data input coupled to line 134 and is clocked with either the read or write clock (inverted) on line 98. The output Q of flip-flop 138 is the signal on line 124 used to increment counter 110.

A D-type flip-flop 140 has its data input coupled to line 52 shown in FIG. 2. As previously described, this data input on line 52 is the trigger signal coupled by switch 50 in any one of its rotary positions onto line 52. Flip-flop 140 is clocked with the write clock on line 80 and produces an output Q on a line 142. Another D-type flip-flop 144 is clocked with the signal on line 142 and has its data input coupled to supply $V_{cc}$ over a line 146.

Flip-flop 144 has a clear line 148, an output Q coupled to a line 150 and an output $\overline{Q}$ coupled to the line 130 to set the latch 126.

A manual switch 152 controls the time of reading the data in memory 106 in relation to the time that the trigger signal is received on line 52. In particular, if switch 152 is in one position, called a before data position, the data that already is stored in memory 106 at the time the trigger signal is received on line 52 is the data that is read from memory 106 and displayed on the oscilloscope 16. If the switch 152 is in the other position, called the after data position, then new data is written into memory 106 at all 256 address locations immediately after the trigger signal is received on line 52, followed by this new data being read from memory 106 and displayed on oscilloscope 16. In the before data position, switch 152 couples clear line 148 to a line 154 and line 150 to a line 156. In the after data position, switch 152 couples the line 150 to line 154 and line 124 to line 156. Flip-flop 86 has its clock input coupled to line 156, its clear input coupled to line 154 and its data input coupled to supply $V_{cc}$ over a line 158.

In the overall operation of test unit 14 in the memory mode, assume that clock generator 78 has been manually switched to produce the internally generated write clock on line 80, rather than any externally received clock on line 81, and that the frequency of this internally generated write clock has been manually adjusted to a certain frequency, for reasons which will be described. Assume also that it is desired to trigger the oscilloscope 16 when a predetermined 8-bit number appears at the test points TP-1 to TP-8. Therefore, reference signal generator 68 is preset to generate this number for comparator 64 shown in FIG. 2. Also, switch 50 is rotated to connect line 70 to line 52. Furthermore, switch 34 and switch 54 are placed in the memory mode position. Finally, assume that it is desired to display on oscilloscope 16 the data written into memory 106 prior to the time the 8-bit predetermined number appears on line 66. Consequently, switch 152 of FIG. 6 is placed in the before data position.

Now, when test probes 20-1 to 20-8 are coupled to test points TP-1 to TP-8, comparator 64 of FIG. 2 will be receiving 8-bit numbers over line 66, as well as the predetermined 8-bit number on line 69. At this time, flip-flop 86 of FIG. 6 will be cleared, whereby output $\overline{Q}$ on line 88 will be high and output Q on line 96 will be low. Therefore, as described above, 8-bit data appearing on line 66 will be written into memory 106 at the frequency of the internally generated write clock selected by clock select logic 84 and used to increment address counter 102. The internally generated write clock is continuously generated so that 8-bit data is continuously written into memory 106.

Now, when the predetermined 8-bit number appears on line 66 of FIG. 2, comparator 64 produces a high on line 70 which is coupled through switch 50 and line 52 to the data input of flip-flop 140. The write clock on line 80 then clocks flip-flop 140 to produce a high on line 142 which clocks flip-flop 144. Consequently, flip-flop 144 now produces a high on line 150, which is coupled through switch 152 to line 156 to clock flip-flop 86, and a low on line 130 to set latch 126. Flip-flop 86 now switches state, producing a high on line 96 and a low on line 88 so that address counter 102 is incremented with the read clock on line 98 and memory 106 placed in the read state. Counter 110 is enabled by the signal on line 88, whereby multiplexer 108 is addressed to select on channel in memory 106. Also, memory 106 is addressed through 256 addresses by counter 102, whereby 256 bits in the one channel are outputted on line 114.

When latch 126 is set with the low on line 130, the two inputs to comparator 132 on line 128 and line 104 are equal so that the output on line 134 goes high, which is coupled through switch 54 onto line 72 to trigger the oscilloscope 16. Address counter 102 can be at any count at the time latch 126 is set, e.g., count 150. Consequently, the presently selected channel of 256 bits of data from memory 106 by multiplexer 108 now appear on the oscilloscope 16 over one trace. Then, when address counter 102 is clocked a fully cycle back to a count of 150 by the read clock, comparator 132 produces another high on line 134 which triggers oscilloscope 16. Also, the high on line 134 appears at the data input of flip-flop 138 which is clocked by the inverted read clock on line 98 to produce a high on line 124. Therefore, counter 110 is incremented by 1, causing multiplexer 108 to select the next channel of 256 bits in memory 106 for display on oscilloscope 16 over another trace. This process continues indefinitely so that the result is a display of 8 traces of data on oscilloscope 16, each trace being 256 bits in length. The data being displayed is that which occurred before the predetermined number appeared on line 66.

Now assume that it is desired to display on oscilloscope 16, the data that occurs subsequent to the occurrence of a predetermined number on line 66, i.e., after data. The switch 152 is placed in the after data position for this operation. Also, a reset switch (not shown) should be depressed to reset the various components of circuit 76. As discussed previously, data now is continuously written into memory 106 at the frequency of the internally generated write clock after placement of test probes 20-1 to 20-8.

Thereafter, when the predetermined number appears on line 66, comparator 64 produces a high on line 70 which again ultimately is coupled to the data input of flip-flop 140. This flip-flop 140 then is clocked by the write clock on line 80 to produce a high on line 142 which clocks flip-flop 144. Consequently, flip-flop 144 produces a low on line 130 to set latch 126 with the address from counter 102, which, for example, is at a count of 232. At the time flip-flop 144 is so clocked, flip-flop 86 is enabled via line 154. Also, flip-flop 138 will have been clocked to produce a high on line 124 which appears via switch 152 on line 156. Flip-flop 86, therefore, is not clocked because there is no low to high transition at this time. Thus, flip-flop 86 remains in the write state and address counter 102 is clocked at the frequency of the write clock.

On the next write clock pulse following the occurrence of the predetermined number on line 66, the output of comparator 134 goes low and flip-flop 138 is clocked to produce a low on line 124 which appears on line 156. Thereafter, address counter 102 cycles through again to the count of 232 and in doing so, new data is written in to memory 106 at all 256 locations. Then, when counter 102 is again incremented to the count of 232, comparator 132 produces a high on line 134 which ultimately triggers oscilloscope 16 and which is clocked through by flip-flop 138 and switch 152 to clock flip-flop 86 on low to high transition on line 156. Consequently, flip-flop 86 switches state so that memory 106 is placed in the read state, address counter 102 is continuously incremented with the read clock on line 102, and counter 110 is enabled with the low on line 88 and incremented by 1 with the high on line 124. Thereafter, the 8 channels of after data stored in memory 106 are continuously displayed on oscilloscope 16 as described above for the before data mode of operation.

The above-described memory mode procedure can be used, for example, when running a software program on the logic circuit 12. The before data displayed on oscilloscope 16 can correspond to a number of instructions of 8-bit length preceding the occurrence of a predetermined instruction, while the after data displayed on oscilloscope 16 can correspond to a number of instructions subsequent to such a predetermined instruction.

In this memory mode, the triggering of the oscilloscope 16 has been described as occurring ultimately in response to the output of comparator 64, which is fed through switch 50 and line 52 to the data input of flip-flop 140. However, this triggering could result from any other occurrence previously described, such as a signal on line 24-6 or a delayed external signal on line 60. This is accomplished in this memory mode merely by rotating switch 50 to any of its positions. Either before data or after data stored in memory 106 will then be displayed on oscilloscope 16.

With each 3-bit address produced by counter 110, resistors $R_6$-$R_8$ produce a different DC offset that is added to the data being output on line 114 from multiplexer 108. Such a DC offset ensures that one trace of data of 256 bits displayed on oscilloscope 16 is sufficiently vertically displaced from the adjacent traces so that there is no vertical overlap of displayed pulses in the respective traces.

As can be appreciated from the above, the adjustable internally generated write clock produced by clock generator 78 determines how often the data on line 66 is sampled or stored in memory 106. If, for example, the internally generated write clock is adjusted to sample this data on line 66 once every microsecond, then data less than one microsecond in duration may not be sampled, i.e., this data will not appear on the oscilloscope 16. Consequently, an appropriate write clock frequency can be selected by manually adjusting a potentiometer (not shown) on the clock generator 78. In this connection, if extremely high accuracy for the internally generated write clock frequency is required, test unit 14 first can be placed in the real time mode and switch 26-1 positioned to connect line 29 of FIG. 2, which carries the write clock, to line 28-1. Also, while not shown in FIG. 2, switch 50 can have another position through which this clock can be fed to trigger the oscilloscope 16. As a result, this write clock will be displayed on a trace of the oscilloscope 16 so that the potentiometer can then be finely adjusted to attain the desired frequency. The triggering off of the write clock ensures that the oscilloscope 16 will trigger off of a pulse and display a stable pattern of write clock pulses. Thereafter, the test unit 14 can be switched into the memory mode.

As already mentioned, clock generator 78 can be manually switched to couple an external clock received on line 81 onto line 80 to become the write clock for circuit 76. Whereas the internally generated write clock that is produced by clock generator 78 is periodic at a presettable frequency, the external clock can occur at a random rate to provide for data sampling at a random rate. For example, assume that the logic circuit 12 changes state in response to a keyboard operator pushing keys on a keyboard (not shown). Each time a key is depressed, a pulse can be sent from, for example, a microprocessor associated with the keyboard, onto line 81 which then becomes a write clock pulse on line 80. The rate at which the operator depresses the keys varies or is random, so that the external write clock now applied on line 80 occurs at a random rate. In other words, samples of data are written into memory 106 only when a key is depressed.

The internally generated read clock produced by clock generator 78, as also previously described, is preset and fixed. Essentially, the frequency of the read clock must be such that the display of pulses on the oscilloscope 16 appears to be static. For example, the read clock frequency should be set to display statically 8 channels or lines.

The circuit 76 can be modified for the following reasons. Assume that 256 instructions of 8-bit length have been stored in memory 106 and are being displayed on oscilloscope 16 as indicated in FIG. 7. The 256 pulses on each trace will appear as very short duration pulses on the screen of the oscilloscope 16. The density of the pulses is so high that it may be difficult to see all this information on the respective traces. The sweep time of the oscilloscope 16 can be quickened, which has the effect of increasing the pulse duration, but reducing the amount of information seen on the oscilloscope, e.g., only pulses 1-25 for each trace.

To solve this potential problem, the circuit 76 can be modified in the following manner. The output on line 134 is not sent directly to switch 54 to trigger the oscilloscope 16, but to a variable delay (not shown), whose output is sent to the switch 54. Then, the variable delay can be continuously moved to change the time that the oscilloscope 16 is triggered. This has the effect of moving the traces on the oscilloscope 16 so that, e.g., pulses 1-25 can be seen, or pulses 26-50, or pulses 51-75, etc., as the variable delay is adjusted to a new position.

Other aspects, objects and advantages of this invention can be obtained from a study of the drawings, the disclosure and the appended claims.

I claim:

1. A test unit for identifying output signals at a plurality of test points of a logic circuit on an oscilloscope having a scope signal input and a scope triggering input, said unit comprising:
    (a) a plurality of test probes being connectable to the plurality of test points to sense the output signals, respectively;
    (b) means for producing summed signals;
    (c) a plurality of impedance elements having different weighted values, each of said impedance elements being connected between one of said test probes and said producing means;
    (d) means for coupling the summed signals to the scope signal input;
    (e) means for selectively coupling and decoupling said test probes from said producing means; and
    (f) means for supplying a triggering signal to the scope triggering input in response to one of the sensed output signals.

2. A test unit according to claim 1 wherein said means for selectively coupling and decoupling comprises a plurality of switches, each being connected between one of said test probes and said producing means.

3. A test unit according to claim 2 wherein said plurality of switches are manual.

4. A test unit according to claim 1 wherein said means for supplying comprises means for selectively coupling one of the sensed output signals to the scope triggering input.

5. A test unit according to claim 4 wherein said means for selectively coupling one of the sensed output signals comprises a switch having a plurality of positions for connection to said test probes, respectively.

6. A test unit according to claim 1 further comprising means for receiving a signal external of the logic circuit, said means for supplying being constructed to supply the external signal to the scope triggering input.

7. A test unit according to claim 6 wherein said means for receiving the external signal comprises means for selectively delaying or not delaying the external signal.

8. A test unit according to claim 1 wherein said means for producing comprises a summing junction.

9. A test unit for identifying output signals at a plurality of test points of a logic circuit on an oscilloscope having a scope signal input and a scope triggering input, said unit comprising:
   (a) a plurality of test probes being connectable to the plurality of test points to sense the output signals, respectively;
   (b) means, having a summing junction, for producing summed signals;
   (c) a plurality of resistors having different weighted values, each of said resistors being connected between one of said test probes and said summing junction;
   (d) a plurality of first switches being connected between said test probes and said resistors, respectively, said first switches having one position coupling said test probes to said summing junction and another position decoupling said test probes from said summing junction;
   (e) a second switch having a plurality of selective positions and being connected to one of said test probes when in one of said plurality of selective positions to couple one of the sensed output signals to the scope triggering input; and
   (f) means for conducting the summed signals to the scope signal input.

10. A test unit according to claim 9 further comprising:
    (a) means for receiving a signal external of the logic circuit; and
    (b) means for conducting the external signal either delayed or undelayed, said second switch having additional positions to couple the external signal delayed or undelayed to the scope triggering input.

11. A test unit according to claim 10 wherein said means for conducting the external signal comprises:
    (a) a first delay line having an adjustable delay; and
    (b) a second line without a delay.

12. A test unit according to claim 9 further comprising an additional pair of probes being connectable to the logic circuit to supply power for the test unit from the logic circuit.

13. A test unit for identifying output signals at a plurality of test points of a logic circuit on an oscilloscope having a first scope signal input, a second scope signal input and a scope triggering input, comprising:
    (a) a first set of a plurality of first test probes being connectable to a first set of the plurality of test points to sense the output signals;
    (b) first means, having a first summing junction, for producing first summed signals;
    (c) a first plurality of first impedance elements having different weighted values, each of said first impedance elements being connected between one of said first test probes and said first summing junction;
    (d) a plurality of first switches being connected between said first test probes and said first impedance elements, respectively, said first switches having one position coupling said first test probes to said first summing junction and another position decoupling said first test probes from said first summing junction;
    (e) first means for conducting the first summed signals to the first scope signal input;
    (f) a second set of a plurality of second test probes being connectable to a second set of the plurality of test points to sense the output signals;
    (g) second means, having a second summing junction, for producing second summed signals;
    (h) a second plurality of second impedance elements having different weighted values, each of said second impedance elements being connected between one of said second test probes and said second summing junction;
    (i) a plurality of second switches being connected between said second test probes and said second impedance elements, respectively, said second switches having one position coupling said second test probes to said second summing junction and another position decoupling said second test probes from said second summing junction;
    (j) second means for conducting the second summed signals to the second scope signal input;
    (k) a comparator having a first input, a second input and an output;
    (l) means for coupling the sensed output signals of said test probes to said first input of said comparator;
    (m) means for selectively generating and for coupling a predetermined logic reference signal to said second input of said comparator;
    (n) means for receiving a signal external of the logic circuit;
    (o) a first delay line for carrying the external signal;
    (p) a second line having no delay for carrying the external signal; and
    (q) switch means for selectively connecting any one of said first test probes, said second test probes, said output of said comparator, said first delay line or said second line to the scope triggering input.

14. A test unit for identifying output signals at a plurality of test points of a logic circuit on an oscilloscope having a scope signal input and a scope triggering input, comprising:
    (a) a plurality of test probes being connectable to a plurality of test points to sense the output signals;
    (b) a memory;
    (c) means for writing the output signals into and for reading the output signals from said memory;
    (d) means for producing weighted summed signals in response to the output signals from said test probes;
    (e) first switch means for coupling the output signals read from said memory or the weighted summed signals to the scope signal input;
    (f) means for providing and for coupling therethrough a first signal in response to at least one of the output signals from said test probes, said means for writing and for reading being responsive to the first signal to generate a second signal; and (g) second switch means for coupling the first signal or the second signal to the scope triggering input.

15. A test unit according to claim 14 wherein said means for writing and for reading comprises selectable means, responsive to the first signal, for reading from said memory the output signals written into said memory before the occurrence of the signal or the output signals written into said memory after the occurrence of the first signal.

16. A test unit according to claim 14 wherein said means for writing and for reading comprises:
   (a) clock generator means for producing an internally generated write clock and an internally generated read clock;
   (b) means for selecting either the internally generated write clock or the internally generated read clock; and
   (c) means for addressing said memory in response to the selected internally generated write clock or the internally generated read clock.

17. A test unit according to claim 16 wherein said clock generator means includes means for adjusting the frequency of the internally generated write clock.

18. A test unit according to claim 17 further comprising means for displaying the internally generated write clock on the oscillocope.

19. A test unit according to claim 14 wherein said means for writing and for reading comprises:
   (a) a clock generator, having a write clock output and a clock input, for producing an internally generated write clock; and
   (b) means for switching said clock generator to couple an external clock on said clock input onto said write clock output or the internally generated write clock onto said clock output.

20. A test unit according to claim 14 further comprising means for delaying the second signal to said second switch means.

21. A test unit according to claim 14 wherein said means for providing and for coupling comprises:
   (a) a comparator having a first input, a second input and an output;
   (b) means for conducting the output signals from said test probes to said first input of said comparator;
   (c) means for selectively generating and for coupling a predetermined reference signal to said second input of said comparator; and
   (d) means for connecting said output of said comparator to said means for writing and for reading to couple the first signal thereto.

22. A test unit for identifying first output signals at a plurality of test points of a logic circuit on an oscilloscope having a first scope signal input, a second scope signal input and a scope triggering input, comprising:
   (a) a first set of a plurality of first test probes being connectable to a first set of the plurality of test points to sense the first output signals;
   (b) first means, selectively connected to said first test probes, for producing first, weighted, summed signals;
   (c) a second set of a plurality of second test probes being connectable to a second set of the plurality of test points to sense the first output signals;
   (d) second means, selectively connected to said second test probes, for producing second, weighted summed signals;
   (e) a memory;
   (f) means, connected to said first set and second set of test probes, for writing the first output signals into and for reading the first output signals from said memory;
   (g) first switch means for selectively coupling the first and second, weighted, summed signals to the first scope signal input and the second scope signal input or the first output signals read from said memory to the first scope signal input and the second scope signal input;
   (h) means for providing and for coupling therethrough a third signal in response to at least one of the first signals from said first set and said second set of test probes, said means for writing and for reading being responsive to the third signal to generate a fourth signal; and
   (i) second switch means for selectively coupling the third signal or the fourth signal to the scope triggering input.

* * * * *

UNITED STATES PATENT AND TRADEMARK OFFICE
CERTIFICATE OF CORRECTION

PATENT NO. : 4,390,837
DATED : June 28, 1983
INVENTOR(S) : Kevin Hotvedt

It is certified that error appears in the above-identified patent and that said Letters Patent is hereby corrected as shown below:

Column 15, line 7, before "signal" insert --first--.

Signed and Sealed this

Twenty-fourth Day of January 1984

[SEAL]

Attest:

GERALD J. MOSSINGHOFF

Attesting Officer

Commissioner of Patents and Trademarks